US010305253B2

(12) United States Patent
Shtyrkova et al.

(10) Patent No.: US 10,305,253 B2
(45) Date of Patent: May 28, 2019

(54) METHODS AND APPARATUS FOR MODE-LOCKING ON-CHIP LASERS

(71) Applicant: Massachusetts Institute of Technology, Cambridge, MA (US)

(72) Inventors: Katia Shtyrkova, Arlington, MA (US); Erich P. Ippen, Belmont, MA (US); Franz X. Kaertner, Hamburg (DE); Patrick T. Callahan, Cambridge, MA (US); Michael R. Watts, Hingham, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 70 days.

(21) Appl. No.: 15/592,905

(22) Filed: May 11, 2017

(65) Prior Publication Data

US 2018/0269653 A1 Sep. 20, 2018

Related U.S. Application Data

(60) Provisional application No. 62/334,697, filed on May 11, 2016.

(51) Int. Cl.
*H01S 5/06* (2006.01)
*H01S 5/065* (2006.01)
(Continued)

(52) U.S. Cl.
CPC .......... *H01S 5/0657* (2013.01); *H01S 3/0637* (2013.01); *H01S 3/1112* (2013.01);
(Continued)

(58) Field of Classification Search
CPC .... H01S 5/0657; H01S 5/02453; H01S 5/026; H01S 5/041; H01S 5/042; H01S 5/0604;
(Continued)

(56) References Cited

U.S. PATENT DOCUMENTS 3,700,307 A 10/1972 Glenn
5,058,986 A 10/1991 Nayar et al.
(Continued)

OTHER PUBLICATIONS

International Search Report and Written Opinion dated Mar. 9, 2018 for International Application No. PCT/US2017/032088, 17 pages.
(Continued)

*Primary Examiner* — Armando Rodriguez
(74) *Attorney, Agent, or Firm* — Smith Baluch LLP

(57) ABSTRACT

An artificial saturable absorber uses additive pulse mode-locking to enable pulse operation of an on-chip laser operation. Four different artificial saturable absorbers are disclosed. The first includes an integrated coupler, two arms each containing some implementation of the end-reflector, and a phase bias element in one arm. The second includes an integrated directional coupler, two integrated waveguide arms, and another integrated coupler as an output. The third includes an integrated birefringent element, integrated birefringent-free waveguide, and integrated polarizer. And the fourth includes a multimode waveguide that allows for different modes to propagate in such a way that the difference in the spatial distribution of intensity causes a nonlinear phase difference between the modes. These are just some examples of an on-chip fully integrated artificial saturable absorber with instantaneous recovery time that allow for generation of sub-femtosecond optical pulses at high repetition rates using passive mode-locking.

15 Claims, 9 Drawing Sheets

(51) Int. Cl.
*H01S 3/063* (2006.01)
*H01S 3/11* (2006.01)
*H01S 5/024* (2006.01)
*H01S 5/026* (2006.01)
*H01S 5/04* (2006.01)
*H01S 5/042* (2006.01)
*H01S 5/062* (2006.01)
*H01S 5/0625* (2006.01)
*H01S 5/10* (2006.01)
*H01S 3/08* (2006.01)
*H01S 3/082* (2006.01)
*H01S 3/16* (2006.01)

(52) U.S. Cl.
CPC .......... *H01S 5/026* (2013.01); *H01S 5/02453* (2013.01); *H01S 5/041* (2013.01); *H01S 5/042* (2013.01); *H01S 5/0604* (2013.01); *H01S 5/0651* (2013.01); *H01S 5/06236* (2013.01); *H01S 5/06246* (2013.01); *H01S 5/06251* (2013.01); *H01S 5/1007* (2013.01); *H01S 3/082* (2013.01); *H01S 3/08054* (2013.01); *H01S 3/1616* (2013.01); *H01S 3/1636* (2013.01)

(58) Field of Classification Search
CPC ............ H01S 5/06236; H01S 5/06246; H01S 5/06251; H01S 5/0651; H01S 5/1007
See application file for complete search history.

(56) References Cited

U.S. PATENT DOCUMENTS

| | | |
|---|---|---|
| 5,175,736 A | 12/1992 | Woodward et al. |
| 6,031,851 A | 2/2000 | Shimizu et al. |
| 6,275,512 B1 | 8/2001 | Fermann |
| 6,710,911 B2 | 3/2004 | Locascio et al. |
| 6,760,151 B1 | 7/2004 | Vail et al. |
| 6,903,820 B2 | 6/2005 | Wang |
| 2009/0310631 A1* | 12/2009 | Kaertner ................. H01S 3/067 372/21 |
| 2010/0296529 A1 | 11/2010 | Andersen et al. |

OTHER PUBLICATIONS

Byun et al., "Integrated Low-Jitter 400-MHz femtosecond waveguide laser," IEEE Photonics Technology Letters, vol. 21. No. 12. pp. 763-765 (2009).

Callahan et al., "Double-chirped Bragg gratings in a silicon nitride waveguide," CLEO: 2016 OSA Technical Digest, (Optical Society of America, 2016), paper SF1E.7.

Corral et al., "Optical frequency comb generator based on a monolithically integrated passive mode-locked ring laser with a Mach-Zehnder interferometer," Opt. Lett., vol. 41, No. 9, pp. 1937-1940. (2016).

Haus et al., "Structures for additive pulse mode locking," J. Opt. Soc. Am. B, vol. 8, No. 10, pp. 2068-2076 (1991).

Ippen et al., "Additive pulse mode locking," J. Opt. Soc. Am. B 6 (9), pp. 1736-1745 (Sep. 1989).

Ippen, "Principles of passive mode locking," Appl. Phys. B 58, pp. 159-170 (1994).

Keller et al., "Semiconductor saturable absorber mirrors (SESAMs) for femtosecond to nanosecond pulse generation in solid-state lasers," IEEE J. Sel. Top. Quantum Electron. 2, 435 (1996).

Lau et al., "Octave-spanning mid-infrared supercontinuum generation in silicon nanowaveguides," Opt. Lett., vol. 39, No. 15, pp. 4518-4521 (2014).

Ouellette et al., "Pulse shaping and passive mode-locking with a nonlinear Michelson interferometer," Optics Comm., vol. 60, No. 1,2, pp. 100-103 (Oct. 15, 1986).

Singh et al. "Midinfrared supercontinuum generation from 2 to 6 μm in a silicon nanowire," Optica vol. 2, pp. 797-802 (2015).

Sorace-Agaskar et al., "Integrated mode-locked lasers in a silicon photonics platform," CLEO: 2015 OSA Technical Digest, (Optical Society of America, 2015), paper SM2I.5.

* cited by examiner

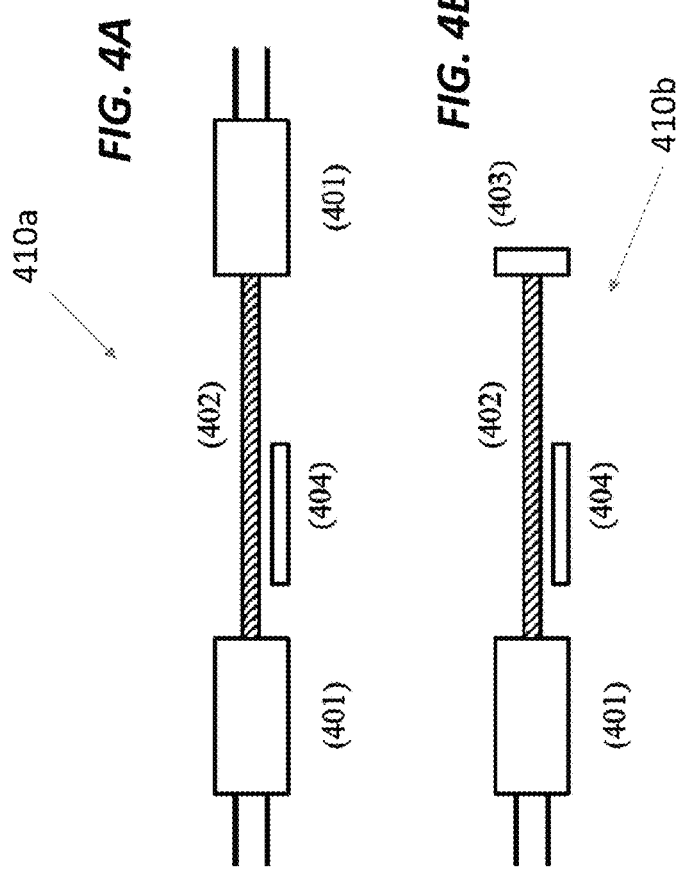
FIG. 4A
FIG. 4B
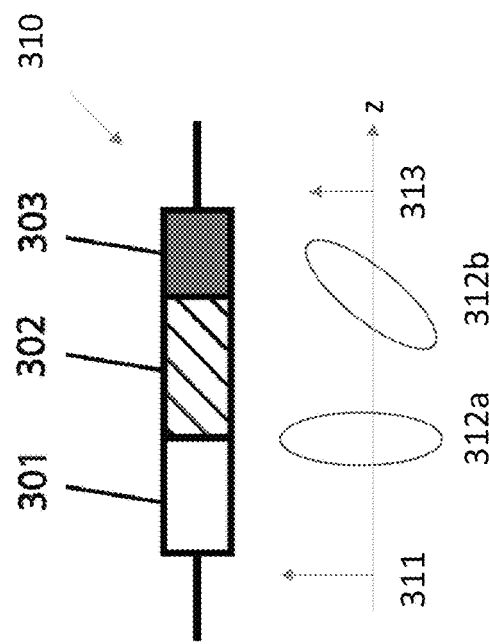
FIG. 3

METHODS AND APPARATUS FOR MODE-LOCKING ON-CHIP LASERS

CROSS-REFERENCE TO RELATED APPLICATION(S)

This application claims the priority benefit, under 35 U.S.C. § 119(e), of U.S. Application No. 62/334,697, filed May 11, 2016, and entitled "INTEGRATED MODE-LOCKING METHODS FOR ON-CHIP MODE-LOCKED LASERS." This application is incorporated by reference herein in its entirety.

GOVERNMENT SUPPORT

This invention was made with Government support under Contract No. HR0011-15-C-0056 awarded by the Defense Advanced Research Projects Agency and under Grant No. FA9550-12-1-0499 awarded by the Air Force Office of Scientific Research. The Government has certain rights in the invention.

BACKGROUND

Numerous devices and methods have been employed in the past for mode-locking of various lasers. Most of those methods have relied on special components and separate alignment procedures to establish the mode-locking.

Active mode-locking uses an amplitude modulator inside the cavity to change the loss at a rate equal to the laser round-trip frequency, resulting in a pulse train. Although it is relatively simple to design and implement, active mode-locking has several limitations. One of the major disadvantages of active mode-locking is that it is hard to scale the pulse width down, which generally ranges from several picoseconds to tens of picoseconds.

Passive mode-locking relies on the intensity-dependent loss element in the laser cavity. When the loss of the cavity is decreased with increasing intensity, pulse formation and shaping follows. This allows the pulse to shape itself after passing through the mode-locking element and thus allows for much shorter optical pulses, as compared with active mode-locking.

Two types of passive mode-locking devices are the fast saturable absorber and the slow saturable absorber. A slow saturable absorber device has a response time that is longer than the pulse duration, while a fast saturable absorber has a response time that is faster than the pulse width. Thus, with the proper balance of dispersion and nonlinearity in the laser cavity, fast saturable absorbers allow for shorter pulse durations than slow saturable absorbers.

A common implementation of a slow saturable absorber is a so-called saturable absorber mirror, which is based on some type of a quantum well structure, where changes in absorption and the time response of the excited carriers allows for the desired loss modulation in the cavity. Such devices operate in both reflection and transmission. Similar techniques have been employed with graphene-based saturable absorbers and other types of saturable absorbers where the material itself provides for intensity-dependent loss dynamics. Typically, such devices require special fabrication steps and frequently require special alignment.

Another class of saturable absorber is based on Kerr nonlinearity. One example of this class is additive pulse mode-locking, which is based on Kerr nonlinearity and has been implemented in free space and in fiber-based systems to achieve stable mode-locking. Additive pulse mode-locking relies on interference between two pulses, which have different intensity-dependent nonlinear optical phases. This phase difference yields an intensity-dependent interference when the pulses recombine, and thus allows for intensity-dependent transmission/reflection.

SUMMARY

Embodiments of the present technology includes a mode-locked laser that includes a substrate, a gain medium integrated on the substrate, and an artificial saturable absorber integrated on the substrate in optical communication with the gain medium. In operation, the gain medium amplifies an optical pulse. And the artificial saturable absorber varies an amplitude of the optical pulse by an amount depending on an intensity of the optical pulse.

The artificial saturable absorber may include a waveguide that comprises a nonlinear material integrated on the substrate. This waveguide imparts a nonlinear phase shift to a first portion of the optical pulse with respect to a second portion of the optical pulse. The nonlinear phase shift depends on the intensity of the optical pulse. In some cases, the waveguide is a first waveguide configured to guide the first portion of the optical pulse along a first intensity-dependent optical path length and the mode-locked laser also includes a second waveguide configured to guide the second portion of the optical pulse along a second intensity-dependent optical path length different than the first intensity-dependent optical path length. In these case, the first waveguide can have a first cross section and the second waveguide can have a second cross section different than the first cross section. The first waveguide can also have a first length and the second waveguide can have a second length different than the first length.

Some examples of the mode-locked laser include a beam splitter in optical communication with the gain medium and the waveguide. The beam splitter splits the optical pulse into the first portion and the second portion, with the first portion having a larger amplitude than the second portion.

In other examples of the mode-locked laser, the waveguide is a first waveguide configured to guide the first portion of the optical pulse and the laser further includes a first reflector, a second waveguide, and a second reflector. The first reflector is in optical communication with the first waveguide and has a first reflectivity. It reflects the first portion of the optical pulse back through the first waveguide. The second waveguide guides the second portion of the optical pulse. And the second reflector is in optical communication with the second waveguide and has a second reflectivity different from the first reflectivity. It reflects the second portion of the optical pulse back through the second waveguide.

The mode-locked laser may include a birefringent element in optical communication with a first end of the waveguide. This birefringent element transforms the optical pulse into an elliptical polarization state. The first portion is a projection of the elliptical polarization state into a first polarization eigenstate of the waveguide and the second portion is a projection of the elliptical polarization state into a second polarization eigenstate of the waveguide. A polarizer in optical communication with a second end of the waveguide polarizes an output of the waveguide. This output is in a polarization state dependent on the nonlinear phase shift.

The waveguide may be a multimode waveguide. In these cases, the first portion is a first mode guided by the multimode waveguide and the second portion is a second mode guided by the multimode waveguide. And in these cases, the mode-locked laser may also include a mode converter, in optical communication with the multimode waveguide, that couples the first portion into the first mode and the second portion into the second mode.

Still other examples of the present technology include integrated artificial saturable absorbers for a mode-locked laser. One such saturable absorber includes a substrate and a nonlinear interferometer integrated onto the substrate. In operation, the nonlinear interferometer varies an amplitude of an optical pulse via interference between a first portion of the optical pulse and a second portion of the optical pulse This interferometer may include a beam splitter to split the optical pulse into the first portion and the second portion, with the first portion having a first peak amplitude and the second portion having a second peak amplitude at least nine times smaller than the first peak amplitude. The interferometer may also include a waveguide, in optical communication with the beam splitter, having a core, cladding, cross section, and/or length selected to produce an intensity-dependent phase shift in the first portion with respect to the second portion. This intensity-dependent phase shift resulting in the interference between the first portion and the second portion.

Another integrated artificial saturable absorber for a mode-locked laser includes a substrate, a birefringent element integrated on the substrate, a birefringence-free waveguide integrated on the substrate in optical communication with the birefringent element, and a polarizer integrated on the substrate in optical communication with the birefringence-free waveguide. In operation, the birefringent element transforms an optical pulse into an elliptical polarization state. The birefringence-free waveguide guides the optical pulse and rotates the elliptical polarization state by an amount depending on the intensity of the optical pulse. And the polarizer polarizes an output of the birefringence-free waveguide.

Yet another integrated artificial saturable absorber for a mode-locked laser includes a substrate and a nonlinear interferometer, which is integrated onto the substrate and includes a mode converter and a multimode waveguide. The nonlinear interferometer varies an amplitude of an optical pulse via interference between a first portion of the optical pulse and a second portion of the optical pulse. It does this using the mode converter, which splits the optical pulse into the first portion and the second portion, the multimode waveguide, which is in optical communication with the mode converter and has a core, cladding, cross section, and/or length selected to produce an intensity-dependent phase shift in the first portion with respect to the second portion. This intensity-dependent phase shift results in the interference between the first portion and the second portion.

All combinations of the foregoing concepts and additional concepts discussed in greater detail below (provided such concepts are not mutually inconsistent) are part of the inventive subject matter disclosed herein. In particular, all combinations of claimed subject matter appearing at the end of this disclosure are part of the inventive subject matter disclosed herein. The terminology used herein that also may appear in any disclosure incorporated by reference should be accorded a meaning most consistent with the particular concepts disclosed herein.

BRIEF DESCRIPTIONS OF THE DRAWINGS

The skilled artisan will understand that the drawings primarily are for illustrative purposes and are not intended to limit the scope of the inventive subject matter described herein. The drawings are not necessarily to scale; in some instances, various aspects of the inventive subject matter disclosed herein may be shown exaggerated or enlarged in the drawings to facilitate an understanding of different features. In the drawings, like reference characters generally refer to like features (e.g., functionally similar and/or structurally similar elements).

FIG. 3 shows an integrated nonlinear polarization rotation artificial saturable absorber suitable for use in an on-chip mode-locked laser.

FIG. 4A shows an integrated artificial saturable absorber using multimode interference operated in transmission.

FIG. 4B shows an integrated artificial saturable absorber using multimode interference operated in reflection.

DETAILED DESCRIPTION

Figure 1A:
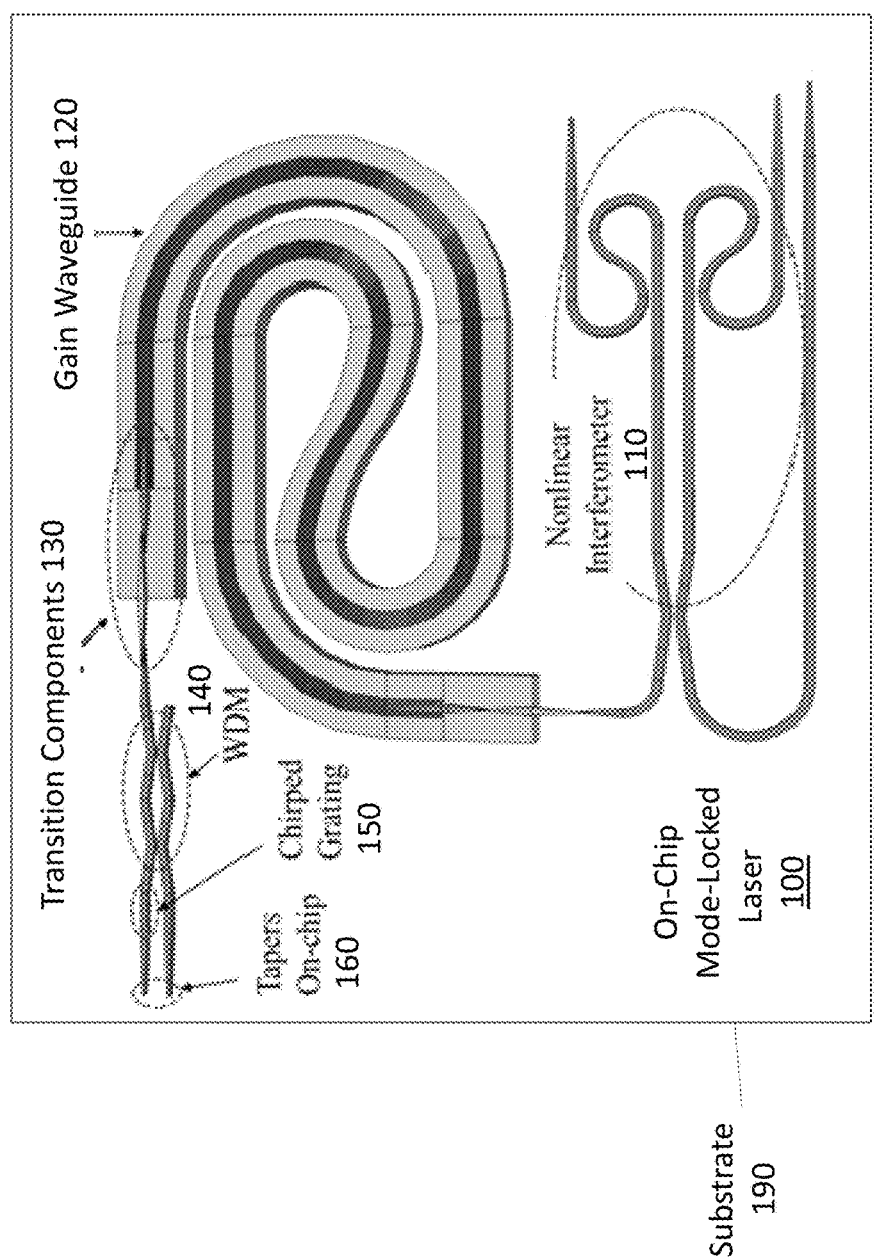
FIG. 1A is a schematic of an on-chip mode-locked laser with an integrated artificial saturable absorber.

High repetition rate femtosecond lasers in integrated systems are desired for compact mass producible frequency metrology devices, low-noise oscillators, photonic analog-to-digital conversion, digital optical synthesizers, and sensor and spectroscopy applications. One element of such lasers is the mode-locking mechanism. The most common approach to achieve passive mode-locking involves using a saturable absorber device, which has been often implemented with a semiconductor saturable absorber, but also with graphene, quantum dots, and other materials. While such devices have been shown to be robust, they require numerous fabrication steps, some of which are not necessarily compatible with CMOS processes.

In contrast, the mode-locked lasers disclosed here are fully integrated, CMOS-compatible devices with fast artificial saturable absorbers. These integrated artificial saturable absorbers provide additive pulse mode-locking based on Kerr-effect nonlinear phase accumulation, unlike conventional saturable absorbers, which exhibit intensity-dependent absorption. Because the Kerr nonlinearity is instantaneous, an artificial saturable absorber can be considered a "fast" saturable absorber that allows for sub-femtosecond optical pulses at high repetition rates, provided that the proper dispersion and nonlinearity balance exists in the associated laser cavity. An artificial absorber's achievable modulation depth depends on its design and can be between 0% and 50% (e.g., about 4%, which is sufficient to mode-lock on chip devices). All the proposed devices allow for direct on-chip mode-locking, and, These artificial saturable absorbers can be integrated on chip, without any need for external components such as semiconductor saturable absorber mirrors. They can be formed as a direct extension of a main laser cavity, so no extra alignment is necessary, making fabrication simpler. Because these artificial saturable devices can be made using CMOS processes, the resulting lasers can be co-integrated with CMOS electronics to enable inexpensive mass production of systems with small size, low weight, and low power consumption. (While the examples here are in CMOS-compatible platforms with silicon or silicon nitride buried in $SiO_2$, other on-chip mode-locked lasers and artificial saturable absorbers can be fabricated using any appropriate material platform, so long as the materials chosen provide for practical device lengths and losses at the desired operational wavelength.)

The on-chip mode-locked lasers disclosed here can be used for a number of applications, including generating frequency combs on-chip. They are particularly well-suited for mode-locked laser (MLL) operation in the 2 μm wavelength range, which is advantageous for generating octave-spanning supercontinuum within the transparency window of silicon. For instance, a fully integrated, passively mode-locked laser operating at 1.9 μm may exhibit Q-switched pulsing when pumped at 1.6 μm as disclosed below.

On-Chip Mode-Locked Laser Design and Fabrication

FIG. 1A shows an example of an on-chip mode-locked laser 100 with an artificial saturable absorber 110, implemented in this case as a nonlinear Michelson interferometer on a substrate 190. The laser 100 has a cavity that includes a 13 cm gain waveguide 120, a wavelength division multiplexer (WDM) 140 to separate pump and laser wavelengths, transition components 130 to transition into the active section of the gain waveguide 120, a double-chirped Bragg grating 150 for dispersion compensation, and on-chip waveguide tapers 160 to facilitate coupling of light onto and off the chip. The nonlinear Michelson interferometer acts as both the artificial saturable absorber and the laser's output coupler. The gain waveguide 120 includes an inverted ridge structure, with a segmented silicon nitride slab forming the guiding layer underneath a thin film of thulium-doped $Al_2O_3$.

The mode-locked laser 100 shown in FIG. 1A is pumped with a diode laser (not shown) that is located "off-chip," i.e., the diode laser is not integrated onto the substrate 190. Instead, light from the diode laser is coupled into the laser cavity via the on-chip waveguide tapers 160. In other examples, the diode laser may be integrated on the same substrate as the mode-locked laser and the artificial saturable absorber and coupled to the laser cavity via one or more waveguides fabricated in or on the substrate. An on-chip diode laser could be pumped electrically. Those of skill in the will appreciate that there are a variety of techniques available to integrate diode lasers directly on CMOS platform.

Figure 1B:
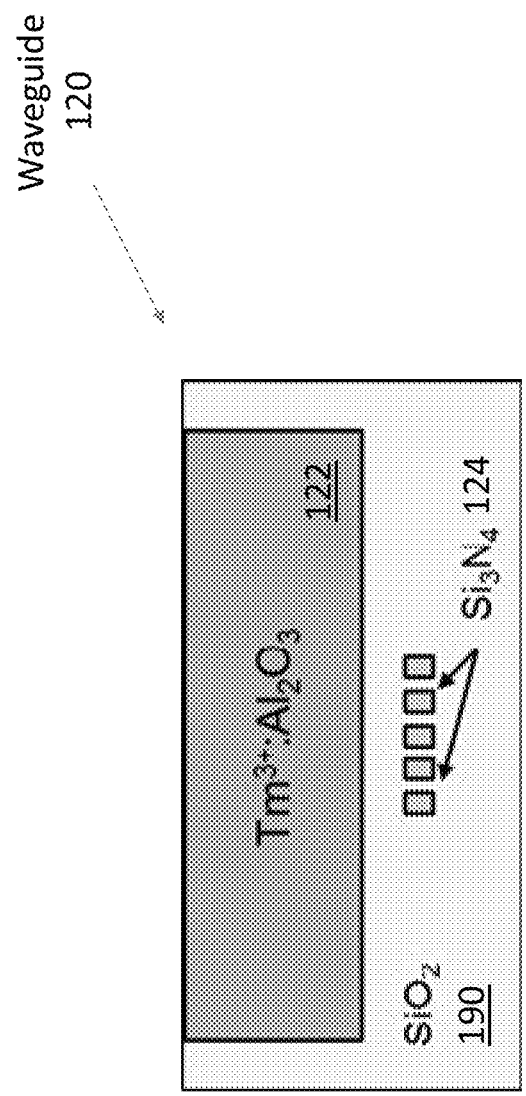
FIG. 1B shows a profile of the gain waveguide of the on-chip mode-locked laser with an integrated saturable absorber.

FIG. 1B shows a cross-section of the gain waveguide 120. In this case, the gain waveguide 120 includes several high-index strips of $Si_3N_4$ 124 embedded below $Tm^{3+}:Al_2O_3$ gain material 122 in the substrate 190, which is formed of $SiO_2$. Likewise, the waveguide(s) in the nonlinear interferometer 110 and other components comprise one or more $Si_3N_4$ strips embedded in the $SiO_2$ substrate 190. In operation, the laser light propagates in the substrate 190 near the $Si_3N_4$ strips 124 as disclosed in U.S. Pat. No. 9,325,140, which is incorporated herein by reference in its entirety.

The gain waveguide 120 and all of the other components in the laser cavity are integrated on-chip and can be fabricated in a 300 mm CMOS foundry, using PECVD to grow the nitride layer and optical immersion lithography to pattern the various waveguide structures. The layer of the $Tm^{3+}:Al_2O_3$ gain material 122 is deposited using reactive co-sputtering.

Those of skill in the art will readily appreciate that there are other suitable architectures, components, and waveguides that may be used in an on-chip mode-locked laser. For instance, the output coupler may be separate from the artificial saturable absorber. The waveguide(s) may have different structures, including, for example, slot, ridge, channel, and compound waveguide designs. The laser and its components may be made of different materials, including IV semiconductors (e.g., silicon), III-V semiconductors (e.g., GaAs, InP), and different dielectric materials (e.g., $SiO_2$, $Si_xN_y$) and metals. An on-chip mode-locked laser may also include another type of integrated artificial saturable absorber, including but not limited to the nonlinear Mach-Zehnder interferometer, polarization rotation device, and multimode interference device described below.

Nonlinear Interferometer as an Artificial Saturable Absorber

Figure 1C:
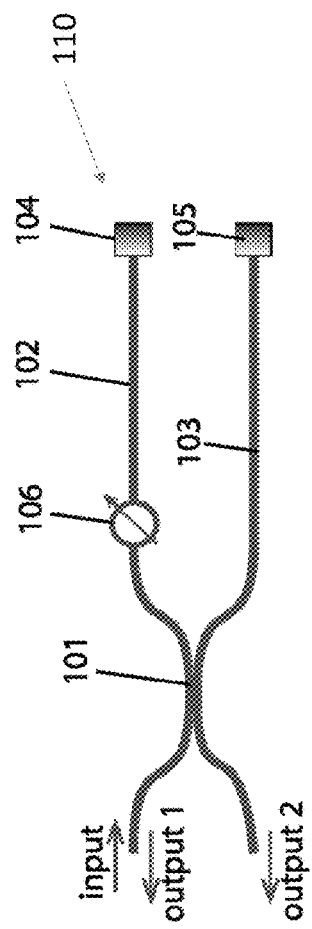
FIG. 1C shows a nonlinear Michelson interferometer suitable for use as an integrated artificial saturable absorber for an on-chip mode-locked laser.

FIG. 1C shows the integrated saturable absorber device 110 from FIG. 1A in greater detail. The artificial saturable absorber 110 has two outputs, labeled output 1 and output 2, and includes an integrated waveguide splitter 101, two waveguide arms 102 and 103, two end-reflectors 104 and 105, and a phase bias 106, which can be implemented in either of the waveguide arms 102 and 103. The phase bias 106 can be implemented as a heater that heats a portion of the waveguide 102 to thermally induce a change in the refractive index of the waveguide 102.

The integrated saturable absorber device 110 operates as follows: light enters the device 110 through the integrated waveguide splitter, which splits the light into two portions, each of which is coupled to a different waveguide arm 102, 103. The portion in each waveguide arm 102, 103 propagates towards the corresponding end-reflector 104, 105, which reflects the portion back into the integrated splitter 101 via the waveguide arm 102, 103. The splitter 101 recombines the two portions of light, causing them to interfere. The output power coupled by the waveguide splitter 101 back into the laser cavity depends on the phase difference between the two arms 102, 103.

The phase difference between the portions propagating in the two arms 102 includes a linear component and a nonlinear component. This nonlinear phase difference causes the output of the artificial saturable absorber 110 to increase or decrease as a function of the input power. While the linear phase shift imparted by each arm is not intensity dependent, the nonlinear phase shift changes as a function of input intensity due to the Kerr nonlinearity:

$$\phi_{NL,i} = \frac{2\pi n_2}{\lambda} I_i L_i$$

where $I_i$ refers to intensity inside of the waveguide, $\lambda$ is the central wavelength, n2 is the nonlinear refractive index (responsible for the Kerr effect), and L is the length of the device. Subscript i=1, 2 stands for a particular waveguide arm 102, 103 of the artificial saturable absorber 110. The intensity is the power inside the waveguide divided by the effective area of the waveguide, which depends on the waveguide's cross-sectional dimensions.

It is possible to achieve different accumulated nonlinear phase in each of the two arms using one of several methods, including those described below. The difference in nonlinear phase between the two arms is a function of the input power. This nonlinear phase difference gives a power-dependent interference of the return signals at the splitter 101, which results in a sinusoidal output power as a function of the input power.

A nonlinear phase difference between the two arms can be achieved by any of the following techniques:

1. Having an integrated splitter 101 splitting power ratio that is different from 50/50 (e.g., 90/10, 91/9, 92/8, 93/7, 94/6, 95/5, 96/4, 97/3, 98/2, or 99/1). The more unbalanced the splitter 101, the greater the accumulated nonlinear phase difference. (The saturable absorber effect is not always greater just because the imbalance and the nonlinear phase difference are greater—it goes to zero as the splitting ratio goes to 100/0 as well as at 50/50.) For example, the splitting ratio may leave as little power as possible in one arm and as much as possible in the other arm.
2. Having two end-reflectors 104 and 105 with different reflectivities. If one reflector has, for example, 10% reflection and the other reflector has 90% reflection, there will be different intensities in the two arms of the device, and thus will lead to a nonlinear phase difference and artificial saturable absorption. This can be accomplished by configuring one end-reflector as the laser's output coupler such that it reflects a fraction of the incident light (e.g., 10-80%) and transmits the rest (e.g., 20-90%).
3. Having waveguide arms 102 and 103 of different lengths. As the nonlinear phase in each arm 102, 103 is proportional to the length of that arm, the nonlinear phase difference between the waveguide arms 102 and 103 could be achieved simply by having the arms be different lengths, which can range, e.g., from 40 µm to 20 cm. Care should be taken to account for differential group delay between the two arms so that the optical pulses in each arm arrive back at the splitter at a time difference short enough to permit the desired output pulse duration (e.g., at the same time) after traveling through the waveguide arms 102 and 103.
4. Having waveguide arms 102 and 103 with different cross-sectional geometries (e.g., different widths). The Kerr nonlinearity of the waveguide depends on both the materials used for the waveguide and the exact waveguide geometry. Having different cross sections results in different effective nonlinearities in each interferometer arm, which results in a different nonlinear phase shift. For example, the cross section may have an area A such that the ratio of the area to the square of the operating wavelength $\lambda$ is $0.001 \leq A/\lambda^2 \leq 10$. Generally, the cross section can be altered by varying the waveguide width, which can range, e.g., from about $0.02\lambda$ to about $4\lambda$, µm, where $\lambda$ is operating wavelength. Care should be taken to match the group delays between the two arms, e.g., by selecting the arm lengths to compensate for the group-delay mismatch caused by the different cross sections.
5. Techniques 1-4 can be used together in any suitable combination, e.g., to achieve an even greater nonlinear phase difference than may be possible with just one technique. For example, an artificial saturable absorber may employ an unbalanced coupler, different end-reflectors, and different waveguide cross-sections/lengths to achieve the desired nonlinear phase difference.

If a nonlinear phase difference between the two arms is present, one of two operating regimes is possible: (1) output 1 of the artificial saturable absorber 110 increases as a function of the input power while output 2 decreases as a function of the input power or (2) output 2 of the artificial saturable absorber 110 increases as a function of the input power while output 1 decreases as a function of the input power. To produce a saturable absorber effect, the output power should increase as a function of the input power, i.e., the artificial saturable absorber should operate in regime (1) in the architecture of FIGS. 1A and 1C.

In practice, the splitting ratio of the waveguide splitter 101 and/or the path lengths of the waveguide arms 102 and 103 may be such that the artificial saturable absorber operates in regime (2) instead of regime (1), e.g., due to imperfect fabrication. Fortunately, the phase bias 106 can be used to switch between regimes (1) and (2) by changing the linear component of the phase difference between the waveguide arms 102, 103. The phase bias 106 can be adjusted empirically until the artificial saturable absorber 110 produces the desired output power as a function of input power.

There are numerous implementations of the nonlinear interferometer architecture. One can, for example, use an integrated directional coupler as a splitter device. The end-reflectors could be implemented with, among other things, integrated loop mirrors or integrated gratings. The phase bias can be achieved by positioning an integrated heater close to the device. The main waveguide design for each interferometric arm can be any integrated waveguide that is optimized for a desired effective nonlinearity.

Nonlinear Mach-Zehnder Interferometer as an Artificial Saturable Absorber

Figure 2:
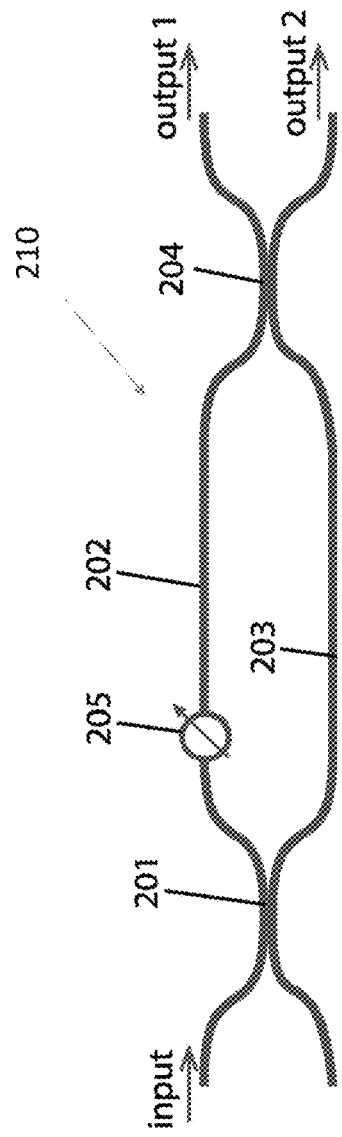
FIG. 2 shows a nonlinear Mach-Zehnder interferometer suitable for use as an integrated artificial saturable absorber for an on-chip mode-locked laser.

FIG. 2 shows an artificial saturable absorber 210 with a nonlinear Mach-Zehnder interferometer architecture that can be used in an on-chip mode-locked laser like the one shown in FIG. 1A (e.g., in place of the artificial saturable absorber 110). This artificial saturable absorber 210 includes an integrated input waveguide splitter 201, two waveguide arms 202 and 203, a phase bias 205, which could be implemented in either of the two arms, and an integrated output waveguide splitter 206. It has two outputs, labeled as output 1 and output 2. The waveguides in the waveguide arms and splitters can be formed using dielectric and/or semiconductor materials integrated onto the same substrate as the laser, making fabrication and alignment simpler than with bulk optical components or hybrid bulk/integrated designs.

The artificial saturable absorber 210 operates as follows: light enters the artificial saturable absorber 210 through the integrated input waveguide splitter 201, which splits the light into two portions that are coupled into the waveguide arms 202 and 203. The portions in each waveguide arm 202, 203 propagate towards the output integrated waveguide splitter 206, which recombines the portions into outputs 1 and 2. This recombination causes interference, producing power levels at outputs 1 and 2 that depend on the relative phase difference imparted on the portions by the waveguide arms 202 and 203.

The relative phase difference includes a nonlinear phase difference that causes the power levels at the artificial saturable absorber's outputs to increase or decrease as a function of the input power. Conceptually, this is very similar to the artificial saturable absorber 110 shown in FIGS. 1A and 1C, except that the artificial saturable absorber 210 shown in FIG. 2 has an integrated output waveguide splitter 204 instead of end reflectors and therefore operates in transmission instead of reflection. For the artificial saturable absorber 210 to work as desired, enough nonlinear phase difference must accumulate between the two waveguide arms 202 and 203 to allow for sufficient modulation depth at the output. Therefore, the length(s) of the waveguide arms 202 and 203 should be chosen to accommodate this desired nonlinear phase difference and the desired group delay difference.

The Mach-Zehnder nonlinear interferometer in the artificial saturable absorber 210 can be imbalanced similarly to the nonlinear Michelson interferometer shown in FIG. 1C:
1. Having an input integrated waveguide splitter 201 with a splitting power ratio that is different from 50/50. The more unbalanced the splitter, the greater the accumulated nonlinear phase difference. Suitable splitting ratios include 51/49 and higher, e.g., 90/10, 93/7, 96/4, 99/1, etc.
2. Having waveguide arms 202 and 203 of different lengths. As the nonlinear phase in each arm is proportional to the length of that arm, the nonlinear phase difference between the waveguide arms 202 and 203 could be achieved simply by having the arms be different lengths. In this case, care should be taken to account for differential group delay between the two arms, in order for optical pulses from each arm to arrive back to the splitter, after traveling through the nonlinear interferometer, within a time difference compatible with the desired pulse duration.
3. Having waveguide arms 202 and 203 with different cross-sectional geometries (e.g., different widths). The Kerr nonlinearity of the waveguide depends on the materials used for the waveguide and the waveguide geometry. Having different cross sections can result in different effective nonlinearities in each interferometer arm 202 and 203. These different effective nonlinearities can cause different nonlinear phase shifts, resulting in a net phase difference. Care should be taken to appropriately match the group delays between the two waveguide arms 202 and 203, e.g., by selecting waveguide arm lengths to compensate for any group-delay mismatch caused by different cross sections.
4. Any combination of methods (1)-(3) could be used to achieve even greater nonlinear phase difference than what would be possible with just one method. For example, one could employ an unbalanced coupler, and different waveguide cross-sections/lengths in order to achieve the nonlinear phase difference desired.

Implementation methods for the Nonlinear Mach-Zehnder Interferometer are similar to those of the nonlinear interferometer. One can, for example, use an integrated directional coupler as a splitter device. The phase bias could be achieved by positioning an integrated heater close to the device. The main waveguide design for each interferometric arm could be any integrated waveguide that is optimized for a desired effective nonlinearity. If used inside a laser cavity, the proposed Mach-Zehnder device can also include an integrated optical isolator to reduce or prevent lasing in two directions.

Nonlinear Polarization Rotator as an Artificial Saturable Absorber

FIG. 3 shows a polarization-based artificial saturable absorber 310 that can used to mode-lock an on-chip laser, e.g., in place of the artificial saturable absorber 110 shown in FIG. 1A. It can be formed of dielectric and/or semiconductor materials integrated onto the same substrate as the laser. As shown in FIG. 3, the artificial saturable absorber 310 includes a birefringent waveguide element 301, a birefringence-free waveguide 302, and an integrated polarizer 303 in optical series. When operating in the laser cavity, the device may also have optical isolator (not shown) to reduce or prevent lasing in two directions.

The artificial saturable absorber 310 employs nonlinear polarization rotation (NPR) as indicated by the polarization states 311, 312a, 312b, and 313 of light propagating into, through, and out of the artificial saturable absorber 310. In operation, light enters the artificial saturable absorber 310 from the main laser cavity (not shown) in a first polarization state, e.g., vertical polarization 311. It passes through the birefringent waveguide element 301, which transforms the polarization state of the incident light into an elliptical polarization state 312a. The elliptical polarization propagates through a birefringence-free waveguide 302 in which the left-hand-circular and right-hand circular polarization components have different Kerr indices. The nonlinear phase difference caused by the different Kerr indices rotates the polarization ellipse to a rotated elliptical polarization state 312b. This nonlinear phase difference between two orthogonal polarization components is proportional to the input power, so the degree of rotation varies with the input power. The integrated polarizer 303 picks out a particular polarization state (e.g., linear vertical 313) for transmission to the rest of the laser cavity. The intensity of the transmitted polarization state 313 depends on the degree of rotation. Thus, as the polarization ellipse 312b rotates in the x-y plane, the output of the integrated polarizer 303 varies periodically with the input optical power.

The polarization-based artificial saturable 310 can be implemented in many different ways. For example, the birefringent waveguide element 301 can be implemented as a strongly birefringent integrated waveguide, the birefringence-free waveguide 302 can be implemented as either a square waveguide or a waveguide where material birefringence and waveguide birefringence cancel each other so there is net zero linear birefringence, and the integrated polarizer 303 can be implemented as an integrated polarization splitter. The polarization-based artificial saturable 310 may also include an integrated isolator.

Nonlinear Multimode Interferometers as Artificial Saturable Absorbers

FIGS. 4A and 4B show artificial saturable absorbers 410a and 410b that use multimode interference to effect nonlinear phase differences. These artificial saturable absorbers 410a and 410b can be integrated onto a substrate and used to mode-lock an on-chip laser, e.g., as shown in FIG. 1A.

Each multimode artificial saturable absorbers 410a, 410b includes at least one mode-converter 401 optically coupled to a multimode waveguide 402, which can be heated with an optional integrated heater 404 to provide a bias offset as described above. The artificial saturable absorber 410a shown in FIG. 4A operates in transmission and has mode converters 401 at both ends of the multimode waveguide 402. And the artificial saturable absorber 410b shown in FIG. 4B operates in reflection and has an integrated reflector 403 at one end of the multimode waveguide 402.

The multimode artificial saturable absorbers 410a, 410b operate as follows: light enters the input mode-converter 401, which couples different portions of the light into different guided modes of the multimode waveguide 402. The modes in the waveguide experience different effective nonlinearities due to their different field distributions, and as such accumulate different values of nonlinear phase. After propagation through the multimode waveguide 401, the modes are recombined at the (output) mode-converter 401. For the reflection-mode artificial saturable absorber 410b, the modes recombine at the input mode-converter 401 after having been reflected by the reflector 403 and propagating back through the multimode waveguide 402. The nonlinear phase difference alters the coupling efficiency at the mode-converter 401 due to interference between the modes and thus produces a transmission or reflection characteristic that is dependent on the input power.

The length of the multimode waveguide 402 is chosen such that the linear phase difference between the modes results in minimum transmission or reflection. The added nonlinear phase increases the transmission or reflection of the device at higher input powers. The optional heater 404 provides the ability to bias the linear phase at any desired operating point, and can help correct for any fabrication variations that result in a non-optimal linear phase.

Each mode converter 401 can be implemented as a two-input, single-output (2×1) device, as shown in FIGS. 4A and 4B, or as a single-input single-output (1×1) device. In the former case, at low input powers the unwanted light is routed to the second port, and is preferentially coupled into the first port at high input powers. In the latter case, the unwanted light is scattered or reflected away from the mode-converter at low input powers, and is coupled through at high input powers.

Experimental Implementations

Integrated Nonlinear Interferometer Design

Figure 5:
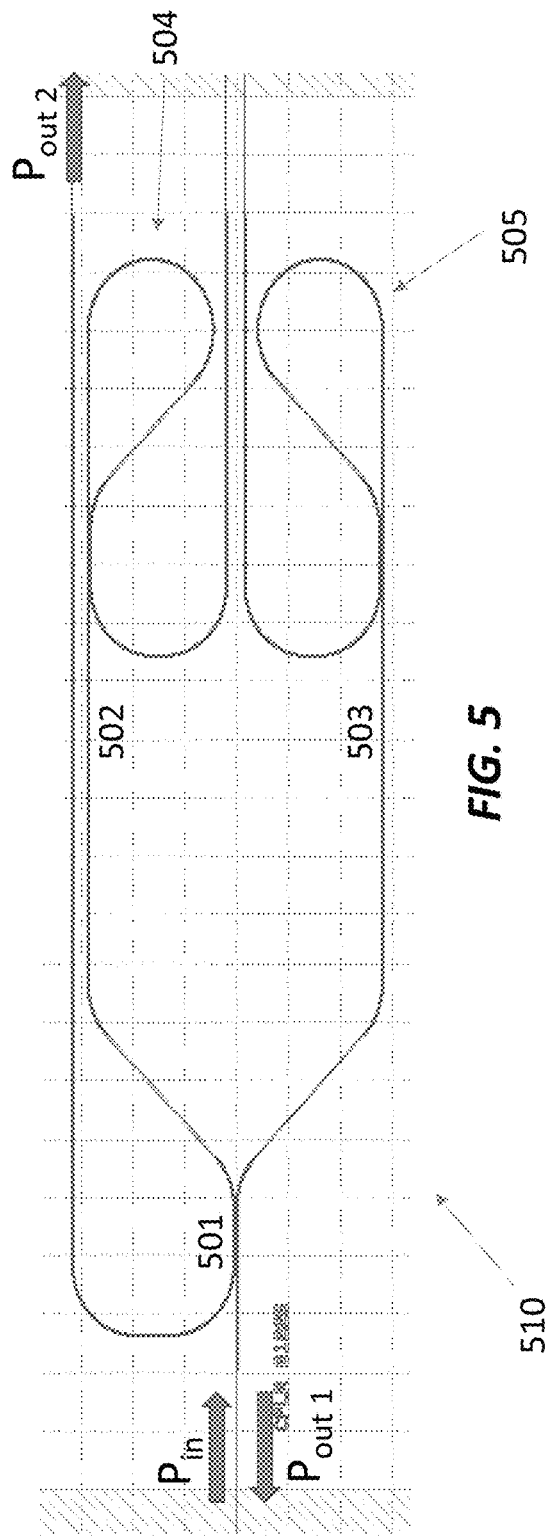
FIG. 5 shows a layout of an integrated nonlinear Michelson interferometer used in an on-chip mode-locked laser.
Figure 6B:
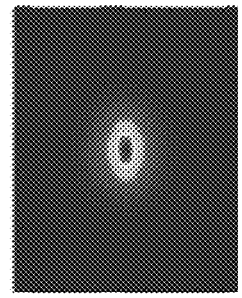
FIG. 6B shows a simulated mode profile (intensity) for the waveguide shown in FIG. 6A.
Figure 6A:
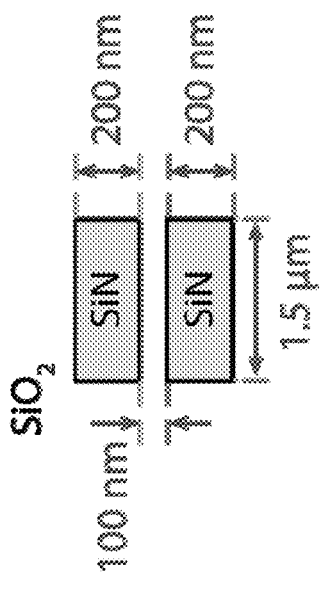
FIG. 6A shows cross-sectional dimensions of the main waveguide of the nonlinear Michelson interferometer shown in FIG. 5.

FIG. 5 shows an integrated implementation 510 of the nonlinear interferometer saturable absorber of FIG. 1C. The material platform in this case uses silicon nitride as a main guiding material and silicon dioxide ($SiO_2$) as a cladding. A directional coupler 501 is used for an integrated waveguide splitter, integrated loop mirrors 504 and 505 are used as end-reflectors, and the main waveguide arms 502 and 503 each include two 1.5 μm wide by 200 nm thick blocks of silicon nitride embedded in $SiO_2$. The silicon nitride blocks are separated by a 100 nm $SiO_2$ layer as shown in FIG. 6A. FIG. 6B shows the mode profile of the beams at a 1.9 μm central wavelength guided by the waveguide arms 502 and 503.

The nonlinear phase difference is created by the directional coupler's highly imbalanced splitting ratio. The lengths and cross-sections of the waveguide arms 502 and 503 are the same in order to match the group-delay. The waveguide geometry was chosen in order to maximize the effective nonlinearity of the waveguide at the design wavelength (1.9 μm). The length of each arm is about 2.4 cm one way, the effective nonlinearity of the waveguide is 0.7 (W m)$^{-1}$, and the dispersion of the main waveguide is 822 fs$^2$/mm. With proper fabrication or applied bias, the output power through output 1 should initially increase with input pump power and the output power from output 2 should decrease with increasing input pump power.

Simulated Performance

Figures 7A, 7B:
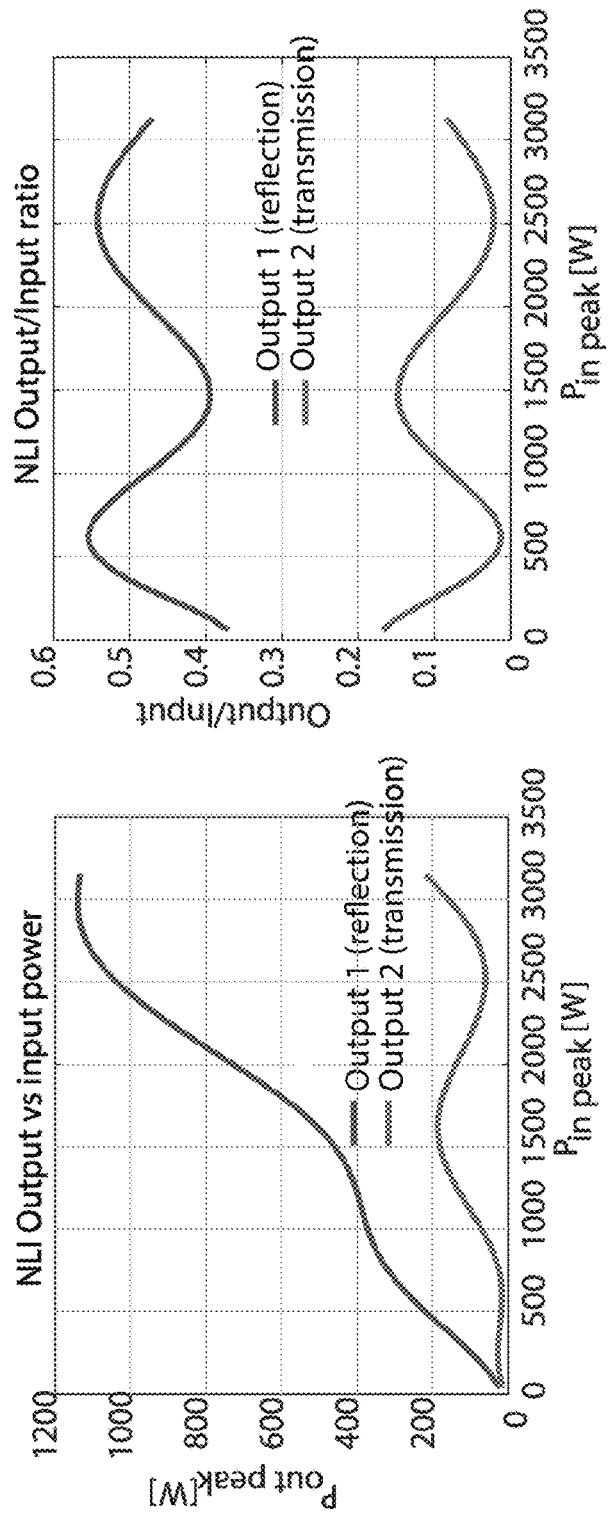
FIG. 7A is a plot of simulated output peak power versus input peak power for the integrated nonlinear Michelson interferometer of FIG. 5.
FIG. 7B is a plot of the simulated ratio of output to input power versus input peak power for the integrated nonlinear Michelson interferometer of FIG. 5.

FIGS. 7A and 7B illustrate results of a full simulation of the artificial saturable absorber shown in FIG. 5 using simulated parameters for the nonlinearity and dispersion, and measured parameters for the loop mirror reflections, linear loss, and integrated coupler splitting ratio. FIG. 7A shows the output peak power as a function of the input peak power, while FIG. 7B shows the output reflection and transmission, in percent, where reflection is defined as the power in output 1 divided by the input power, and transmission is defined as the power in output 2 divided by the input power. The simulation shows that the reflection/transmission of this device is nonlinear with respect to input power. Total output power may not be equal to the sum of reflection and transmission due to the linear loss of the device.

Experimental Measurements

Figure 8:
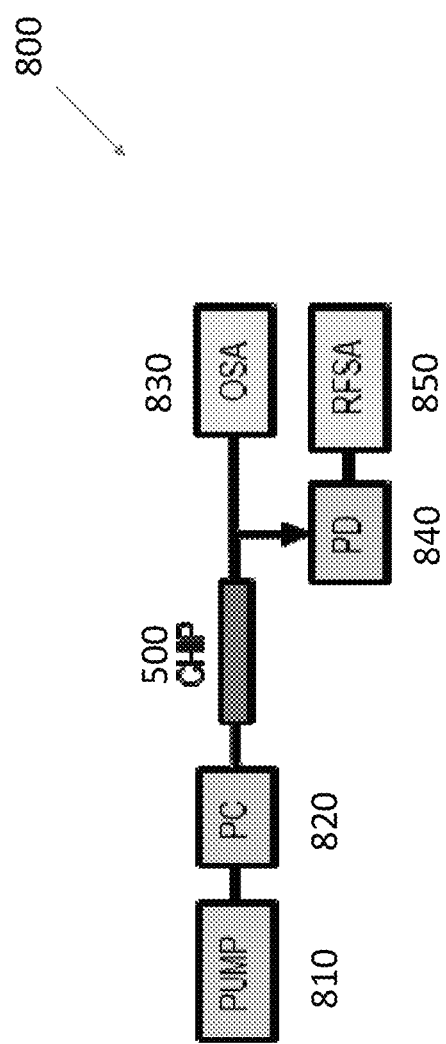
FIG. 8 is a schematic of an experimental setup for testing an on-chip mode-locked laser with an artificial saturable absorber that includes an integrated nonlinear Michelson interferometer.

FIG. 8 is a schematic of an experimental setup used to test an on-chip mode-locked laser structure 500 with the artificial saturable absorber 510 shown in FIG. 5. The pump light from a pump laser 810 passed through a polarization controller 820 and is coupled onto the chip 500 using a lensed fiber, which was mode-matched to a nitride waveguide at the chip facet to reduce coupling losses. The laser output was then collected with another lensed fiber from output 2 of the artificial saturable absorber 510 and measured with an optical spectrum analyzer (OSA) 830. The time-domain behavior and RF spectrum were measured with a radio-frequency spectrum analyzer (RFSA) 850 coupled to the output of a photodiode 840.

The saturable absorber device was fully characterized using ultrafast optical pulses. The response of the device for a certain peak power was recorded using the OSA 830 and RFSA 850. The variation of output peak power as a function of input peak power determines the intensity-dependent loss of the device. For slow saturable absorbers, pump-probe based experiments are used to determine the recovery time of the device; however, in the case of Kerr-based saturable absorber devices like the one shown in FIG. 5, the nonlinearity is assumed to be instantaneous, and no such experiments are needed.

The artificial saturable absorber 510 was characterized using both linear and nonlinear characterization setups. The linear characterization setup included a low-power, continuous-wave (cw) laser at 1.9 μm central wavelength as the pump laser 810. This setup was used to measure the integrated coupler, the loop mirrors, and the linear loss of the device.

Nonlinear characterization of the device was performed using an optical parametric oscillator (OPO) as the pump laser 810. The OPO was centered at a wavelength of 1.9 μm with an 80 MHz pulse repetition rate and a pulse duration of 200 fs. In order to not pre-chirp the input pulses, light was coupled from the OPO into the chip 500 using a free-space objective instead of a fiber. Light was collected at the output of the waveguide using a lensed fiber. An optical chopper and lock-in amplifier (not shown) were used in order to detect small changes in the device output power.

Experimental Results

TABLE 1 lists results of characterization using the low-power cw laser:

| | |
|---|---|
| Splitter Ratio | 91/9 |
| Loop mirror 1 reflection | 99% |
| Loop mirror 2 reflection | 98% |
| Linear loss | 0.5 dB/cm |

Figures 9A, 9B:
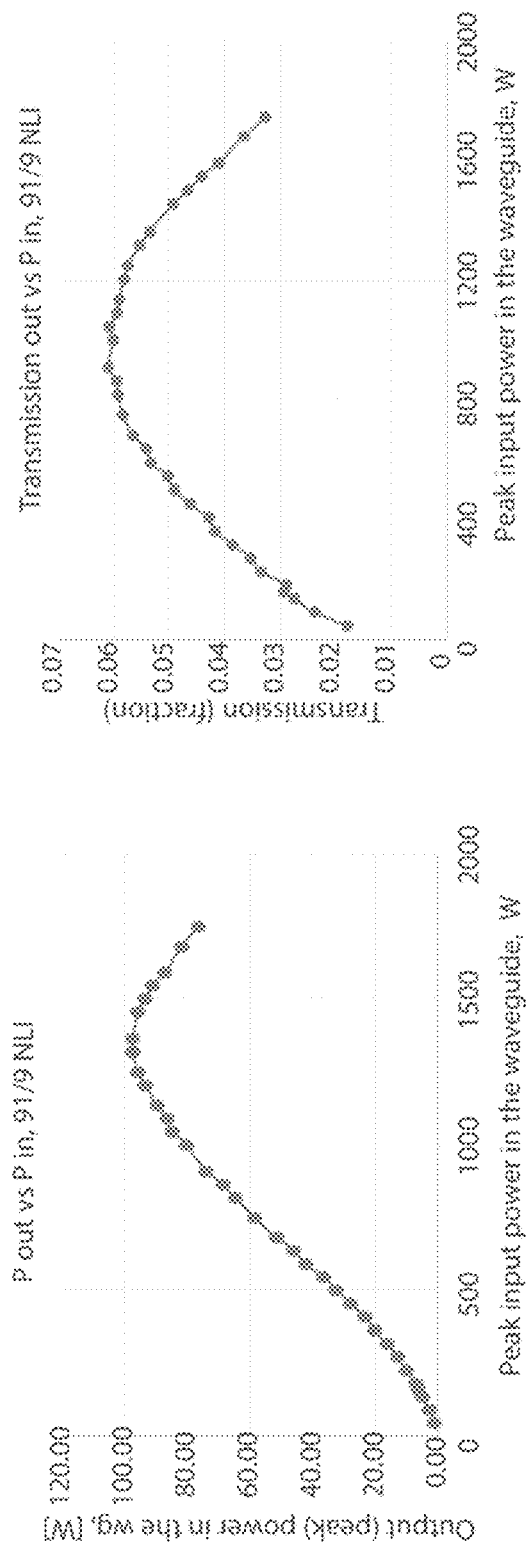
FIG. 9A is a plot of measured output peak power (output 2) versus input peak power an on-chip mode-locked laser with an artificial saturable absorber that includes an integrated nonlinear Michelson interferometer.
FIG. 9B is a plot of the measured ratio of output (output 2) to input power versus input peak power for an on-chip mode-locked laser with an artificial saturable absorber that includes an integrated nonlinear Michelson interferometer.

FIGS. 9A and 9B show the dependence of the output power on the input power measured using ultrafast pulses from the OPO. Output power was measured at output 2 (FIG. 5), and facet coupling losses were calibrated out. FIG. 9A shows the output peak power versus input peak power. FIG. 9A shows the ratio of the peak output power to the peak input power versus input peak power.

The results in FIGS. 9A and 9B are in good agreement with the simulations shown in FIGS. 7A and 7B, although there appears to be some linear phase bias in the data that shifts the curve either to the left or to the right of its original position. This phase bias may be attributed to fabrication variations on the cross section on the waveguide, which are well within the specified fabrication tolerances. A heater (e.g., phase bias 106 in FIG. 1C) can be used to compensate for the effects of these fabrication variations.

The modulation depth of this device is about 4%, which is enough to mode-lock an integrated laser. The source laser used to test those devices was a high peak power OPO. With an integrated on-chip laser, the peak power would be much lower. However, the simulations in FIGS. 7A and 7B show that this nonlinear interferometer is capable of supporting on-chip mode-locking for realistic on-chip peak powers, as only a fraction of 1% modulation depth could be enough to stabilize the mode-locking with the proper laser cavity design. For instance, an example on-chip mode-locked laser may have 200 mW intracavity average power at a 700 MHz repetition rate and a 200 fs pulse duration to achieve kW peak powers fully exploiting the modulation depth of the NLI and reliably self-starting the laser.

Figure 10C:
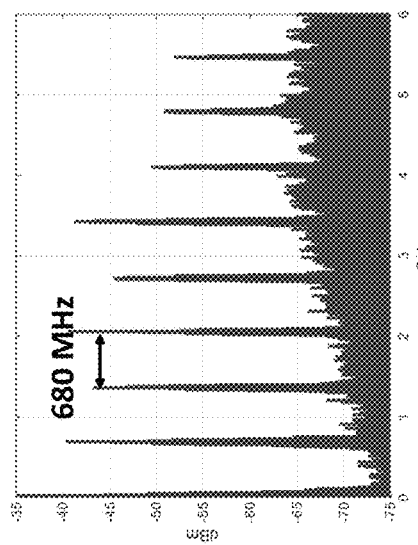
FIG. 10C shows the measured RF spectrum of detected pulses showing harmonics of the cavity repetition rate of 680 MHz for an on-chip mode-locked laser with an artificial saturable absorber that includes an integrated nonlinear Michelson interferometer.
Figure 10B:
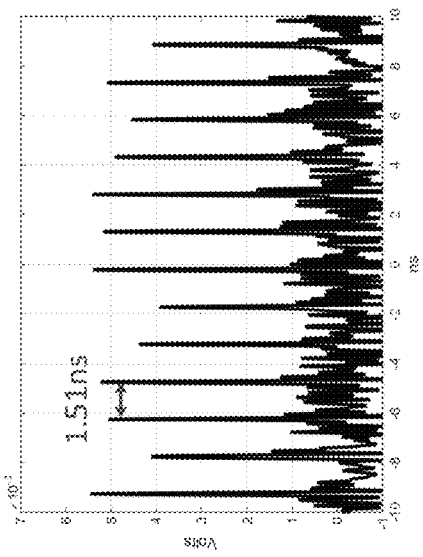
FIG. 10B shows the measured time-domain behavior of Q-switched pulses with a pulse repetition rate of 560 kHz for an on-chip mode-locked laser with an artificial saturable absorber that includes an integrated nonlinear Michelson interferometer.
Figure 10A:
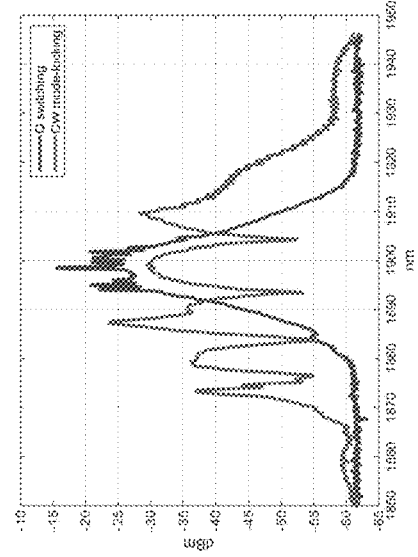
FIG. 10A shows the measured optical spectrum of laser output for various input pump powers for an on-chip mode-locked laser with an artificial saturable absorber that includes an integrated nonlinear Michelson interferometer.

FIGS. 10A-10C show additional measurements that show Q-switched and mode-locked pulsing demonstrated with the saturable absorber shown in FIG. 5. FIG. 10A shows the output optical spectrum of the laser for different input pump power levels. As the pump power was increased, the laser went from a Q-switched mode-locking state to a cw mode-locking state, with pulses as shown in FIG. 10B. As the pump power was increased to above approximately 1 W of on-chip power, the laser went from Q-switching to mode-locking. FIG. 10C shows the radio-frequency spectrum with harmonics spaced at 680 MHz.

Conclusion

While various inventive embodiments have been described and illustrated herein, those of ordinary skill in the art will readily envision a variety of other means and/or structures for performing the function and/or obtaining the results and/or one or more of the advantages described herein, and each of such variations and/or modifications is deemed to be within the scope of the inventive embodiments described herein. More generally, those skilled in the art will readily appreciate that all parameters, dimensions, materials, and configurations described herein are meant to be exemplary and that the actual parameters, dimensions, materials, and/or configurations will depend upon the specific application or applications for which the inventive teachings is/are used. Those skilled in the art will recognize, or be able to ascertain using no more than routine experimentation, many equivalents to the specific inventive embodiments described herein. It is, therefore, to be understood that the foregoing embodiments are presented by way of example only and that, within the scope of the appended claims and equivalents thereto, inventive embodiments may be practiced otherwise than as specifically described and claimed. Inventive embodiments of the present disclosure are directed to each individual feature, system, article, material, kit, and/or method described herein. In addition, any combination of two or more such features, systems, articles, materials, kits, and/or methods, if such features, systems, articles, materials, kits, and/or methods are not mutually inconsistent, is included within the inventive scope of the present disclosure.

Also, various inventive concepts may be embodied as one or more methods, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of" "only one of" or "exactly one of"

"Consisting essentially of," when used in the claims, shall have its ordinary meaning as used in the field of patent law.

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified. Thus, as a non-limiting example, "at least one of A and B" (or, equivalently, "at least one of A or B," or, equivalently "at least one of A and/or B") can refer, in one embodiment, to at least one, optionally including more than one, A, with no B present (and optionally including elements other than B); in another embodiment, to at least one, optionally including more than one, B, with no A present (and optionally including elements other than A); in yet another embodiment, to at least one, optionally including more than one, A, and at least one, optionally including more than one, B (and optionally including other elements); etc.

In the claims, as well as in the specification above, all transitional phrases such as "comprising," "including," "carrying," "having," "containing," "involving," "holding," "composed of," and the like are to be understood to be open-ended, i.e., to mean including but not limited to. Only the transitional phrases "consisting of" and "consisting essentially of" shall be closed or semi-closed transitional phrases, respectively, as set forth in the United States Patent Office Manual of Patent Examining Procedures, Section 2111.03.

The invention claimed is:

1. A mode-locked laser comprising:
   a substrate;
   a gain medium, integrated on the substrate, to amplify an optical pulse; and
   an artificial saturable absorber, integrated on the substrate in optical communication with the gain medium, to vary an amplitude of the optical pulse by an amount depending on an intensity of the optical pulse, wherein the artificial saturable absorber comprises a first waveguide, comprising a nonlinear material integrated on the substrate, to impart a nonlinear phase shift to a first portion of the optical pulse with respect to a second portion of the optical pulse, the nonlinear phase shift depending on the intensity of the optical pulse;
   a first reflector, in optical communication with the first waveguide and having a first reflectivity, to reflect the first portion of the optical pulse back through the first waveguide;
   a second waveguide configured to guide the second portion of the optical pulse; and
   a second reflector, in optical communication with the second waveguide and having a second reflectivity different from the first reflectivity, to reflect the second portion of the optical pulse back through the second waveguide.

2. The mode-locked laser of claim 1, wherein the first waveguide is configured to guide the first portion of the optical pulse along a first intensity-dependent optical path length and
   the second waveguide is configured to guide the second portion of the optical pulse along a second intensity-dependent optical path length different than the first intensity-dependent optical path length.

3. The mode-locked laser of claim 2, wherein the first waveguide has a first cross section and the second waveguide has a second cross section different than the first cross section.

4. The mode-locked laser of claim 2, wherein the first waveguide has a first length and the second waveguide has a second length different than the first length.

5. The mode-locked laser of claim 1, further comprising:
   a beam splitter, in optical communication with the gain medium and the first waveguide, to split the optical pulse into the first portion and the second portion, the first portion having a larger amplitude than the second portion.

6. A mode-locked laser comprising:
   a substrate;
   a gain medium, integrated on the substrate, to amplify an optical pulse; and
   an artificial saturable absorber, integrated on the substrate in optical communication with the gain medium, to vary an amplitude of the optical pulse by an amount depending on an intensity of the optical pulse, wherein the artificial saturable absorber comprises a waveguide, comprising a nonlinear material integrated on the substrate, to impart a nonlinear phase shift to a first portion of the optical pulse with respect to a second portion of the optical pulse, the nonlinear phase shift depending on the intensity of the optical pulse;
   a birefringent element, in optical communication with a first end of the waveguide, to transform the optical pulse into an elliptical polarization state, the first portion being a projection of the elliptical polarization state into a first polarization eigenstate of the waveguide and the second portion being a projection of the elliptical polarization state into a second polarization eigenstate of the waveguide; and
   a polarizer, in optical communication with a second end of the waveguide, to polarize an output of the waveguide, the output being in a polarization state dependent on the nonlinear phase shift.

7. A method of mode-locking a laser, the method comprising:
   amplifying an optical pulse with a gain medium disposed on a substrate;
   varying an amplitude of the optical pulse by an amount depending on an intensity of the optical pulse with an artificial saturable absorber integrated onto the substrate, wherein varying the amplitude of the optical pulse comprises guiding a first portion of the optical pulse via a first waveguide, the first waveguide imparting a nonlinear phase shift to a first portion of the optical pulse with respect to a second portion of the optical pulse, the nonlinear phase shift depending on the intensity of the optical pulse;
   reflecting the first portion of the optical pulse back through the first waveguide with a first reflector having a first reflectivity; and
   reflecting the second portion of the optical pulse back through a second waveguide with a second reflector having a second reflectivity different than the first reflectivity.

8. The method of claim 7, wherein the first waveguide having a first intensity-dependent path length and further comprising:

guiding the second portion of the optical pulse via a second intensity-dependent optical path length different than the first intensity-dependent optical path length.

9. The method of claim 8, wherein the first waveguide has a first cross section and the second waveguide has a second cross section different than the first cross section.

10. The method of claim 8, wherein the first waveguide has a first length and the second waveguide has a second length different than the first length.

11. The method of claim 7, further comprising:
splitting the optical pulse into the first portion and the second portion, the first portion having a larger amplitude than the second portion.

12. A method of mode-locking a laser, the method comprising:
amplifying an optical pulse with a gain medium disposed on a substrate;
varying an amplitude of the optical pulse by an amount depending on an intensity of the optical pulse with an artificial saturable absorber integrated onto the substrate, wherein varying the amplitude of the optical pulse comprises guiding a first portion of the optical pulse via a waveguide, the waveguide imparting a nonlinear phase shift to a first portion of the optical pulse with respect to a second portion of the optical pulse, the nonlinear phase shift depending on the intensity of the optical pulse;
transforming the optical pulse into an elliptical polarization state;
rotating the elliptical polarization state by an amount dependent on the nonlinear phase shift while guiding the optical pulse in the waveguide; and
polarizing an output of the waveguide.

13. An integrated artificial saturable absorber for a mode-locked laser, the saturable absorber comprising:
a substrate; and
a nonlinear interferometer, integrated onto the substrate, to vary an amplitude of an optical pulse via interference between a first portion of the optical pulse and a second portion of the optical pulse, the interferometer comprising:
a beam splitter to split the optical pulse into the first portion and the second portion, the first portion having a first peak amplitude and the second portion having a second peak amplitude at least nine times smaller than the first peak amplitude; and
a waveguide, in optical communication with the beam splitter, having at least one of a core, cladding, cross section, or length selected to produce an intensity-dependent phase shift in the first portion with respect to the second portion, the intensity-dependent phase shift resulting in the interference between the first portion and the second portion.

14. An integrated artificial saturable absorber for a mode-locked laser, the saturable absorber comprising:
a substrate;
a birefringent element, integrated on the substrate, to transform an optical pulse into an elliptical polarization state;
a birefringence-free waveguide, integrated on the substrate in optical communication with the birefringent element, to guide the optical pulse and to rotate the elliptical polarization state by an amount depending on the intensity of the optical pulse; and
a polarizer, integrated on the substrate in optical communication with the birefringence-free waveguide, to polarize an output of the birefringence-free waveguide.

15. An integrated artificial saturable absorber for a mode-locked laser, the saturable absorber comprising:
a substrate; and
a nonlinear interferometer, integrated onto the substrate, to vary an amplitude of an optical pulse via interference between a first portion of the optical pulse and a second portion of the optical pulse, the interferometer comprising:
a mode converter to split the optical pulse into the first portion and the second portion; and
a multimode waveguide, in optical communication with the mode converter, having at least one of a core, cladding, cross section, or length selected to produce an intensity-dependent phase shift in the first portion with respect to the second portion, the intensity-dependent phase shift resulting in the interference between the first portion and the second portion.

* * * * *